United States Patent
Kauer

(10) Patent No.: US 7,504,322 B2
(45) Date of Patent: Mar. 17, 2009

(54) GROWTH OF A SEMICONDUCTOR LAYER STRUCTURE

(75) Inventor: Matthias Kauer, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/558,972

(22) Filed: Nov. 13, 2006

(65) Prior Publication Data

US 2007/0108452 A1   May 17, 2007

(30) Foreign Application Priority Data

Nov. 17, 2005   (GB)   ................................. 0523421.6

(51) Int. Cl.
*H01L 21/84* (2006.01)
(52) U.S. Cl. ........................ 438/479; 438/528; 438/569; 257/E33.027
(58) Field of Classification Search ................. 438/479, 438/569, 34, 45, 528, 22, 47, 39, 42; 257/84, 257/E33.027
See application file for complete search history.

(56) References Cited

U.S. PATENT DOCUMENTS

| | | | |
|---|---|---|---|
| 4,610,731 A | | 9/1986 | Chevallier et al. |
| 4,654,090 A | * | 3/1987 | Burnham et al. ............... 438/36 |
| 4,987,096 A | * | 1/1991 | Ishikawa et al. ............... 438/44 |
| 5,763,291 A | * | 6/1998 | Motoda et al. ................ 438/39 |
| 5,777,350 A | | 7/1998 | Nakamura et al. |
| 6,043,140 A | | 3/2000 | Kawai et al. |
| 6,096,617 A | * | 8/2000 | Kizuki ......................... 438/312 |
| 6,242,761 B1 | * | 6/2001 | Fujimoto et al. ............... 257/94 |
| 6,258,614 B1 | * | 7/2001 | Kaneko ......................... 438/22 |
| 6,410,941 B1 | * | 6/2002 | Taylor et al. ................... 257/84 |
| 6,495,433 B2 | * | 12/2002 | Shin ............................ 438/569 |
| 6,498,111 B1 | * | 12/2002 | Kapolnek et al. ........... 438/762 |
| RE38,613 E | | 10/2004 | Kawai et al. |
| 2005/0163179 A1 | | 7/2005 | Hooper et al. |

FOREIGN PATENT DOCUMENTS

JP   2001-068782 A   3/2001

OTHER PUBLICATIONS

S. Nakamura et al.; "InGaN-Based Multi-Quantum-Well-Structure Laser Diodes;" Jpn. J. Appl. Phys., vol. 35; 1996; pp. L74-L76.

Y. Gao et al.; "AlGaN/GaN Current Aperture Vertical Electron Transistor Fabricated By Photoelectrochemical Wet Etching;" Electronics Letters, vol. 39, No. 1; 2003; pp. 148-149.

(Continued)

*Primary Examiner*—Michael S Lebentritt
(74) *Attorney, Agent, or Firm*—Renner, Otto, Boisselle & Sklar, LLP

(57) ABSTRACT

A method of growing a semiconductor layer structure comprises growing a first semiconductor layer and incorporating hydrogen into the first semiconductor layer. One or more further semiconductor layers are then grown over the first semiconductor layer to form a semiconductor layer structure. A selected portion of the first semiconductor layer is then annealed so as to change the electrical resistance of the selected portion of the first semiconductor layer. The electrical resistance of the one or more further semiconductor layers that have been grown over the first semiconductor layer is not significantly changed by the annealing step. The invention may be used, for example, to create a current aperture in a semiconductor layer within a semiconductor layer structure.

50 Claims, 3 Drawing Sheets

OTHER PUBLICATIONS

J. Dorsaz et al.; "Selective Oxidation of AlInN Layers For Current Confinement In III—Nitride Devices;" Applied Physics Letters 87,072102; 2005.

B. Theys; "Hydrogen Diffusion in III—V Semiconductors: Application to the Fabrication and Optimization of Photonic Devices;" Defect and Diffusion Forum, vols. 157-159; 1998; pp. 191-209.

M.A.L. Johnson et al.; "Reactive MBE Growth of GaN and GaN:H on GaN/SiC Substrates;" Materials Research Society Symp. Proc. vol. 449; 1997; pp. 215-220.

M.S. Brandt et al.; "Hydrogenation of P-Type Gallium Nitride;" Applied Physics Letters, vol. 64 (17); 1994; pp. 2264-2266.

H. Amano et al.; "P-Type Conduction in Mg-Doped GaN Treated with Low-Energy Electron Beam Irradiation (LEEBI);" Japanese Journal of Applied Physics, vol. 28, No. 12; 1989; pp. L2112-L2114.

Y. Kamiura et al.; "Photo-Enhanced Activation of Hydrogen-Passivated Magnesium in P-Type GaN Films;" Jpn. J. Appl. Phys. vol. 37; 1998; pp. L970-L971.

S. Figge et al.; "Heat Generation and Dissipation in GaN-based Light Emitting Devices;" Phys. Stat. Sol. (a), vol. 200, No. 1; 2003; pp. 83-86.

M. Takeya et al., "Novel Methods of P-type Activation in Mg-doped GaN;" Jpn. J. Appl. Phys., vol. 40; 2001; pp. 6260-6262.

P. Kozodoy et al., "Electrical Characterization of GaN $p$-$n$ Junctions With and Without Threading Dislocations;" Applied Physics Letters, vol. 73, No. 7; 1998; pp. 975-977.

G. Hatakoshi et al.; "Thermal Analysis for GaN Laser Diodes;" Jpn. J. Appl. Phys., vol. 38; 1999; pp. 2764-2768.

United Kingdom search report for corresponding UK Application No. GB0523421.6 dated Mar. 16, 2006.

* cited by examiner

GROWTH OF A SEMICONDUCTOR LAYER STRUCTURE

This Nonprovisional application claims priority under 35 U.S.C. § 119(a) on UK Patent Application No. 0523421.6 filed in the United Kingdom on Nov. 17, 2005, the entire contents of which are hereby incorporated by reference.

FIELD OF THE INVENTION

The present invention relates to growth of a semiconductor layer structure, and in particular to growth of a semiconductor layer structure in which one layer has a region of modified resistivity. The method may be applied to growth of a layer structure in, for example, a nitride materials system such as, for example, the (Al,Ga,In)N materials system. A layer structure of the invention may be incorporated in a wide range of electronic and optoelectronic devices such as, for example, a semiconductor laser diode (LD) (including both an edge emitting LD and a vertical LD), or a light-emitting diode (LED) (including a resonant cavity LED).

BACKGROUND OF THE INVENTION

The (Al,Ga,In)N material system includes materials having the general formula $Al_xGa_yIn_{1-x-y}N$ where $0 \leq x \leq 1$ and $0 \leq y \leq 1$. In this application, a member of the (Al,Ga,In)N material system that has non-zero mole fractions of aluminum, gallium and indium will be referred to as AlGaInN, a member that has a zero aluminum mole fraction but that has non-zero mole fractions of gallium and indium will be referred to as InGaN, a member that has a zero indium mole fraction but that has non-zero mole fractions of gallium and aluminum will be referred to as AlGaN, and so on. There is currently considerable interest in fabricating semiconductor light-emitting devices in the (Al,Ga,In)N material system since devices fabricated in this system can emit light in the blue-violet wavelength range of the spectrum (corresponding to wavelengths in the range of approximately 380-450 nm).

Semiconductor light-emitting devices fabricated in the (Al, Ga,In)N materials system are described, for example, by S. Nakamura et al in Jap. J. Appl. Phys., Vol. 35, pp. L74-L76 (1996). They are also described in U.S. Pat No. 5,777,350, which teaches use of the metal-organic chemical vapour deposition (MOCVD) growth technique to fabricate light-emitting devices in the (Al,Ga,In)N materials system. MOCVD (also known as metal-organic vapour phase epitaxy or MOVPE) takes place in an apparatus which is commonly at atmospheric pressure but sometimes at a slightly reduced pressure of typically about 10 kPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

Another known semiconductor growth technique is molecular beam epitaxy (MBE). In contrast to MOCVD, MBE is carried out in a high vacuum environment. In the case of MBE as applied to the (Al,In,Ga)N system, an ultra-high vacuum (UHV) environment, typically around $1 \times 10^{-3}$ Pa, is used. A nitrogen precursor is supplied to the MBE chamber by means of a supply conduit and species providing aluminum, gallium and/or indium, and possibly also a suitable dopant species, are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The nitrogen precursor and the species supplied from the effusion cells travel across the MBE chamber and reach the substrate where epitaxial growth takes place in a manner which is driven by the deposition kinetics.

At present, the majority of growth of high quality nitride semiconductor layers is carried out using the MOCVD process. However, MBE has recently been shown also to produce high-quality nitride optoelectronic devices. For example, US patent application 2005/0163179A1 teaches the use of MBE to fabricate semiconductor light-emitting devices in the (Al, Ga,In)N system.

In many cases it is desirable for the structure of an optoelectronic or electronic semiconductor device to include a layer having a current aperture. Such a layer generally has a high electrical resistance except for a portion which has a low electrical resistance; the high resistance portion of the layer blocks the flow of electrical current, whereas the portion with a low electrical resistance passes electrical current and thereby forms a "current aperture". A current aperture provides spatial confinement of current within the device; in the case of an optoelectronic device, the device can be designed such that light is generated in regions of the device corresponding to the current aperture.

FIG. 1 is a schematic view of a known structure for a vertical cavity semiconductor laser device. The structure has a substrate 1, a first stack 2 of mirror layers, an active region 3 for generation of light, and a second stack 4 of mirror layers. The mirror layers can, for example, be suitable semiconductor or dielectric layers. The first and second stacks 2,4 each form a Bragg mirror for light emitted by the active region 3. The upper part of the laser structure, including the second stack of mirror layers, has a width and thickness that are much less than the width and thickness of the substrate 1 and the first stack 2 of mirror layers, so that the structure has a "step". An electrical contact 5 is placed on the upper surface of the step, and a second contact (not shown) is placed on the underside of the substrate 1.

In the laser of FIG. 1 the active region 3 is wider than the second stack of semiconductor layers. It is therefore desirable to confine the generation of light to the part of the active region that is under the second stack of semiconductor layers, since light that is generated in a part of the active region that is not under the second stack of semiconductor layers will not contribute to the optical output of the laser. The laser is therefore provided with a current blocking layer 6. The current blocking layer 6 is provided between the contact 5 and the active region 3, and has a portion 7 with a high electrical resistance and a portion 8 with a low electrical resistance. The portion 8 with a low electrical resistance defines a current aperture. The low resistance portion 8 is substantially the same size and shape as the cross-section of the upper stack 4 of semiconductor layers, and is aligned with the upper stack 4 of semiconductor layers. Current flow through the current blocking layer is confined to the portion 8 with a low electrical resistance so that current flow through the active region is, as shown by the arrows in FIG. 1, confined to the part of the active region aligned with the low resistance portion 8 of the current aperture layer 6. Thus, in operation, generation of light is substantially confined to the part of the active region that is under the upper stack 4 of semiconductor layers.

Current apertures are especially beneficial in nitride semiconductor vertical cavity devices, where it is difficult to grow electrically conducting semiconductor Bragg mirrors, and where electrical current injection through the Bragg mirror is therefore not practical. The use of current apertures is not however limited to vertical cavity devices, and their usefulness in other nitride optoelectronic devices such as edge-emitting lasers or electronic devices such as transistors will be appreciated by anyone skilled in the art.

While methods exist to create current apertures in other III-V semiconductor material systems, for example by wet oxidation of AlAs layers in GaAs-based devices, existing methods of creating current apertures in devices in III-Nitride material systems are unsatisfactory.

Y. Gao et al. report, in Electr. Lett., Vol. 39, pp 148-149 (2004), the use of photoelectrochemical (PEC) wet etching of AlGaN/GaN layers to create air gap current apertures in electron transistors. While this procedure can in principle be applied in the manufacture of optoelectronic devices such as semiconductor laser diodes, this would require etching material close to the optical mode of the laser diode. It is expected that this would reduce the reliability and lifetime of the laser diode.

J. Dorsaz et al. propose, in Appl. Phys. Lett, Vol. 87, 072102, (2005), anodic oxidation of AlInN in III-Nitride devices to form the high-resistance regions of the current aperture layer. Using oxidised layers in nitrides has so far been reported to be unsuccessful in nitride semiconductor layer structures, and it is not known at present how well this proposed process would work. In particular, the reliability and lifetime of devices with oxidised layers may be affected.

U.S. Pat. No. 6,258,614 discloses a method of creating current apertures that uses selective annealing of p-type layers by lasers of different wavelength. This method requires p-type layers of different bandgaps, which initially are all highly resistive. A current aperture can be created by stacking two p-layers which have different bandgaps to one another and by bandgap-selective laser annealing. This method restricts the freedom in designing a nitride optoelectronic device, in that layers of appropriate bandgap, and matching lasers, have to be used. Annealing processes which are not bandgap-selective, such as electron beam annealing, cannot be used with this method. A further disadvantage is that, since all the p-layers are initially highly resistive, all the layers have to be annealed in the case of, for example, a LD cladding layer of 500 nm typical thickness. This may cause unintentional heating and degradation of the LD active region owing to the cladding layer thickness and its proximity to the active region.

B. Theys reports, in Defect and Diffusion Forum, Vols. 157-159, pp. 191-210, (1998), the hydrogenation of III-V semiconductors to create photonic devices. The paper discusses post-growth hydrogenation of dopants in surface layers, using hydrogen diffusion from a plasma source or hydrogen implantation, to create current confinement zones in the surface layer. In the vast majority of electronic or optoelectronic devices, however, the current aperture is not at a surface of the device but is disposed within the device.

U.S. Pat. No. 4,610,731 discloses a method of creating a low resistance region in each of a sequence of superposed AlGaAs/GaAs layers. Atomic hydrogen is used to neutralise shallow donors in the layers and create highly resistive layers, and a heat annealing process is then used to make a portion of the resistive layer n-type conducting. This method cannot, however provide a current aperture buried within the structure of a device, since every layer in the sequence of layers is heated during the annealing process.

The paper by Theys and U.S. Pat. No. 4,610,731 use hydrogen to vary the free-carrier concentration in a doped semiconductor layer. There are other reports of this technique.

For example, M. A. L. Johnson et al. report, in Mat. Res. Soc. Symp. Proc. Vol. 449, p. 215-220 (1997), on the MBE growth of GaN that is p-doped with magnesium while adding atomic hydrogen during the growth process. The material was studied using photoluminescence experiments, and evidence of p-dopant compensation in the material grown with added hydrogen was found.

M. S. Brandt et al. report, in Appl. Phys. Lett., Vol. 64, pp. 2264-2266 (1994), that the carrier concentration in an MBE-grown p-type GaN layer can be reduced by an order of magnitude using a post-growth hydrogen plasma process.

H. Amano et al. report, in Jap. J. Appl. Phys., Vol. 28, pp. L2112-L2114 (1989), the use of low-energy electron beam irradiation to lower the resistivity of MOCVD-grown Mg-doped GaN. As is now known, Mg-doped GaN grown by MOCVD is highly resistive owing to unintentional incorporation of hydrogen during MOCVD-growth.

U.S. Pat. No. 6,242,761 describes a method of fabricating a nitride semiconductor light-emitting device, in which a layer structure grown by MOCVD is disposed over part of the upper surface of an n-GaN contact layer. A first electrode is disposed over another part of the upper surface of the n-GaN contact layer. The layer structure contains an n-AlGaN cladding layer, an n-GaN guide layer, an active layer, a p-GaN guide layer, a p-AlGaN cladding layer, and a p-GaN contact layer. A second electrode is disposed over the p-GaN contact layer. In the method of U.S. Pat. No. 6,242,761, a reverse bias voltage is applied between the first and second electrodes to cause current to flow through the layer structure, so that Mg (the p-dopant) is activated in the portions of the p-type layers through which current flows; application of the voltage also causes hydrogen in the n-type layers to separate from the crystal in the portions of the n-type layers through which current flows. Low resistance regions are thus formed in the layers (corresponding to the current path through the layer structure), while the portions of the layers through which current does not flow remain with a high resistance.

SUMMARY OF THE INVENTION

A first aspect of the present invention provides a method of growing a semiconductor layer structure, the method comprising the steps of:

a) growing a first semiconductor layer;

b) incorporating hydrogen into the first semiconductor layer;

c) growing one or more further semiconductor layers over the first semiconductor layer thereby to form a semiconductor layer structure; and d) annealing a selected portion of the first semiconductor layer thereby to change the electrical resistance of the selected portion of the first semiconductor layer; wherein the annealing step does not significantly change the electrical resistance of the one or more further semiconductor layers.

Incorporating hydrogen into the first semiconductor layer will mean that the resistance of the first semiconductor layer will be different from the resistance that it would have if hydrogen had not been incorporated into the layer. If, for example, the first semiconductor layer is grown as a doped p-type layer, the effect of incorporating hydrogen will be to passivate the p-type dopants within the layer; the resistance of the first semiconductor layer will be significantly larger than the resistance that it would have if hydrogen had not been incorporated. In this case, the effect of annealing the selected portion of the first semiconductor layer will be to activate the p-type dopants within the selected portion of the first semiconductor layer and thereby reduce the resistance of the selected portion of the first semiconductor layer. The resistance of the regions of the first semiconductor layer that are not annealed will not change, however, and the unannealed regions will retain a high resistance. Thus, a region of modified electrical resistance has been created in the first semiconductor layer.

By arranging that the annealing step does not significantly change the electrical resistance of the one or more further semiconductor layers, it is therefore possible to create a region of modified electrical resistance in a layer that is buried within the layer structure, without modifying the resistance of any of the overlying layers in the layer structure. The region of modified electrical resistance is created in the first semiconductor layer, but this layer is not the surface layer of the device since one or more further layers have been grown over this layer in step (c).

Formation of the region of modified electrical resistance in the first semiconductor layer may be used to obtain a current blocking layer having a current aperture.

Hydrogen may be not incorporated into the one or more further semiconductor layers, whereby the annealing step (d) does not significantly change the electrical resistance of the one or more further semiconductor layers. This will be the case where the semiconductor layers are grown in an atmosphere that does not contain large amounts of hydrogen such as, for example, where the layers are grown by molecular beam epitaxy. It is also possible for MOCVD growth to be carried out in an atmosphere that does not contain large amounts of hydrogen, as described in U.S. Pat. No. 6,043,140. Since hydrogen is not incorporated into the one or more further semiconductor layers, any p-type dopants in these layers will not be passivated. Thus, the resistance of the one or more further semiconductor layers will not be changed when the selected portion of the first semiconductor layer is annealed.

Alternatively, hydrogen may be incorporated into the one or more further semiconductor layers to a concentration lower than the concentration of hydrogen incorporated into the first semiconductor layer. The method may comprise the further step of: e) annealing the semiconductor layer structure to obtain a desired electrical resistance for the one or more further semiconductor layers, step (e) being carried out before step (d) whereby step (d) does not significantly change the electrical resistance of the one or more further semiconductor layers.

This will be the case where the semiconductor layers are grown in an atmosphere that contains hydrogen such as, for example, where the layers are grown by metal organic chemical vapour deposition. MOCVD is usually carried out in a high hydrogen background, and any semiconductor layer grown by MOCVD will have a significant hydrogen content that will passivate p-type dopants. As is well known, it is usually necessary to anneal a doped semiconductor layer grown by MOCVD in order to activate the dopants.

Where the semiconductor layers are grown in an atmosphere that contains hydrogen, the invention is effected by incorporating additional hydrogen into the first semiconductor layer, so that the hydrogen concentration of the first semiconductor layer is greater than the hydrogen concentration that would arise naturally as a result of the hydrogen background in the MOCVD growth process. Preferably no additional hydrogen is incorporated into the one or more further semiconductor layers, so that the hydrogen concentration of these layers is equal to the hydrogen concentration that would arise naturally as a result of the hydrogen background in the MOCVD growth process. When the structure is annealed, the dopants in the one or more further semiconductor layers are activated, so that these layers have a low resistance; however, the duration and temperature of the annealing step are chosen such that the dopants in the first semiconductor layer are not fully activated.

The effect of subsequently annealing the selected portion of the first semiconductor layer will be fully to activate the p-type dopants within the selected portion of the first semiconductor layer and thereby reduce the resistance of the selected portion of the first semiconductor layer. Regions of the first semiconductor layer that are not annealed will, however, continue to contain passivated dopants, and so will retain a high resistance. Thus, a current aperture has again been created in the first semiconductor layer.

Step (b) of incorporating hydrogen into the first semiconductor layer may increase the electrical resistance of the first semiconductor layer, and step (d) of annealing the selected portion of the first semiconductor layer may reduce the electrical resistance of the selected portion of the first semiconductor layer.

Step (a) may comprise incorporating a p-type dopant into the first semiconductor layer.

Step (b) of incorporating hydrogen into the first semiconductor layer may reduce the electrical resistance of the first semiconductor layer, and step (d) of annealing the selected portion of the first semiconductor layer may increase the electrical resistance of the selected portion of the first semiconductor layer.

Step (a) may comprise incorporating a p-type dopant and an n-type dopant into the first semiconductor layer.

Step (b) may be performed simultaneously with step (a). Alternatively, step (b) may be performed subsequent to step (a).

Step (d) may comprise annealing the selected portion of the first semiconductor layer with a laser beam. It may comprise annealing the selected portion of the first semiconductor layer with an electron beam. It may comprise passing an electrical current through the selected portion of the first semiconductor layer. It may comprise passing an electrical current such that the current density in the selected portion of the first semiconductor layer is 5 kA/cm$^2$ or greater.

The selected portion of the first semiconductor layer may be substantially the entire area of the first semiconductor layer. When creating a current aperture it is necessary that only part of the first semiconductor layer has its resistivity changed, so as to create a region of low resistivity (which acts as the current aperture) and one or more regions of high resistivity in the first semiconductor layer. In other application, however, it may be desirable to change the resistivity of the first semiconductor layer over its entire area, and this can be done by annealing the entire area of the first semiconductor layer.

The first semiconductor layer and the one or more further semiconductor layers may be nitride semiconductor layers. As explained above, existing methods of creating a current aperture in nitride material systems are unsatisfactory, and the present invention provides an improved method of creating a current aperture in a nitride semiconductor layer.

The first semiconductor layer may be an (Al,Ga,In)N layer. The or each further semiconductor layer may be an (Al,Ga,In)N layer.

Step (b) may comprise providing atomic hydrogen. Atomic hydrogen (H$^+$) is more effective at passivating dopants in semiconductor layers than molecular hydrogen (H$_2$).

Step (b) may alternatively comprise providing an isotope of hydrogen. It is known that other hydrogen isotopes, such as deuterium, may be used to passivate dopants in semiconductor layers. (The term "isotope of hydrogen" as used herein is intended to exclude $^1$H, and to refer to other isotopes of hydrogen such as $^2$H (deuterium) and $^3$H. The unqualified term "hydrogen" as used herein is intended to cover all isotopes of hydrogen, and thus covers $^1$H, $^2$H etc. The unqualified term "hydrogen" as used herein further covers both molecular hydrogen (H$_2$) and atomic hydrogen (H$^+$).)

Step (a) and step (c) may comprise growing the first semiconductor layer and the one or more further semiconductor layers by molecular beam epitaxy.

Alternatively step (a) and step (c) may comprise growing the first semiconductor layer and the one or more further semiconductor layers by metal organic chemical vapour deposition.

The or each further semiconductor layer may be doped p-type.

A second aspect of the invention provides a semiconductor layer structure grown by a method of the first aspect.

A third aspect of the invention provides a semiconductor laser diode comprising a semiconductor layer structure of the second aspect.

A fourth aspect of the invention provides a semiconductor light-emitting diode comprising a semiconductor layer structure of the second aspect.

BRIEF DESCRIPTION OF THE DRAWINGS

Preferred embodiments of the present invention will now be described by way of illustrative example with reference to the accompanying figures, in which.

DETAILED DESCRIPTION OF THE PREFERRED EMBODIMENTS

The invention will be described with reference to growth of a semiconductor layer structure in a nitride materials system, in particular in the (Al,Ga,In)N system. The invention is not, however, limited to use in the (Al,Ga,In)N materials system, nor even to use in a nitride materials system.

Figure 4:
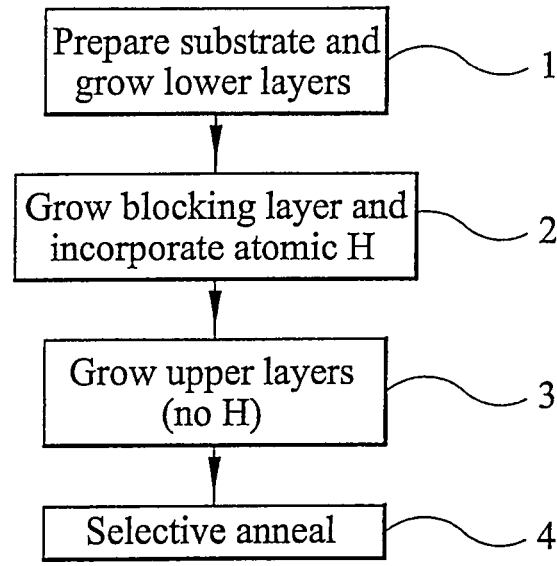
FIG. 4 is a schematic flow diagram illustrating a method according to one embodiment of the present invention.

FIG. 4 illustrates one embodiment of a growth process of the present invention. FIG. 4 shows an embodiment in which growth of the layer structure is carried out in the presence of a low or zero hydrogen background. The method of FIG. 4 is applicable to, for example, a growth process using molecular beam epitaxy; MBE is carried out under high vacuum conditions, and there is substantially no hydrogen background in an MBE growth chamber.

Figure 2:
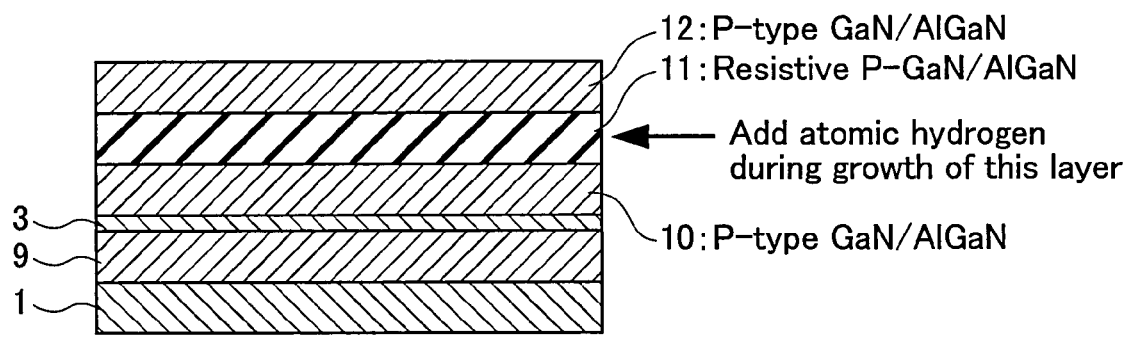
FIGS. 2 and 3 are schematic sectional views showing stages in the manufacture of a semiconductor layer structure by a method of the present invention.

In the method of FIG. 4, a layer in which a current aperture is to be defined is grown over a substrate at step 2. This layer will be referred to as the "current blocking" layer, and is the layer labelled as 11 in FIG. 2. The current blocking layer 11 is a nitride semiconductor layer. In the embodiment of FIG. 2 the current blocking layer 11 is shown as a GaN or AlGaN layer, but the invention is not limited to this particular composition for the current blocking layer 11.

It should be noted that the growth process will comprise steps that are carried out before step 2 of FIG. 4 is performed. For example, a suitable substrate will be processed and cleaned, and introduced into the growth chamber of an MBE apparatus. One or more nitride semiconductor layers may be grown over the substrate 1 before the blocking layer 11 is grown. FIG. 2 shows the application applied to growth of a semiconductor laser diode, and the structure of FIG. 2 contains an active region 3 for light generation, and one or more layers denoted generally as "9" disposed between the substrate 1 and the active region 3. Moreover, one or more nitride semiconductor layers may be grown over the active region 3 before the blocking layer 11 is grown, and these layers are denoted generally by 10 in FIG. 2.

These steps of preparing and cleaning the substrate, growing the lower layer(s) 9, growing the active region 3, and growing any intervening layer(s) 10 between the active region and the current blocking layer may be entirely conventional, and will not be described further. The composition and thickness of the lower layer(s) 9, the active region 3 and the intervening layer(s) 10 will depend on the device structure that is being grown.

In the embodiment of FIG. 2 the current blocking layer 11 is grown as a p-type doped nitride semiconductor layer. Doping the layer p-type would normally lead to the presence of free charge carriers in the layer thereby producing a low electrical resistance. In the method of the invention, however, hydrogen is incorporated into the current blocking layer 11, and this has the effect of passivating the p-type dopant. As a result, the current blocking layer 11 has a high electrical resistivity.

The hydrogen may be incorporated into the current blocking layer 11 during the MBE growth of the current blocking layer by introducing atomic hydrogen into the growth chamber during the step of growing the current blocking layer. Atomic hydrogen (H$^+$) is much more effective than molecular hydrogen (H$_2$) at passivating p-type dopants.

Atomic hydrogen may be generated in the MBE growth chamber by supplying hydrogen gas to the growth chamber and cracking the hydrogen gas into atomic hydrogen, by thermally cracking the hydrogen gas or by using a plasma such as a radio frequency plasma, a continuous wave plasma, a microwave plasma or an ECR (electron cyclotron resonance) plasma source.

Alternatively, the atomic hydrogen may be created by introducing ammonia (NH$_3$) to the MBE growth chamber and by cracking the ammonia to provide atomic hydrogen. Ammonia is sometimes used as the nitrogen precursor in MBE growth of a nitride material and, when the invention is applied in such a case, use of ammonia also as the source of hydrogen is particularly convenient. The ammonia gas may again be cracked by thermal cracking, or a mechanism for additional cracking of ammonia (in addition to the thermal cracking that occurs at the growth surface) may be provided to ensure a sufficient concentration of atomic hydrogen in the growth chamber. The additional cracking mechanism may, for example, use a plasma such as a radio frequency plasma, a continuous wave plasma, a microwave plasma or an ECR plasma source.

If hydrogen gas is supplied to the growth chamber but is not cracked in the growth chamber, molecular hydrogen will be incorporated into the current blocking layer. This may in principle be done although, as noted above, molecular hydrogen is much less effective at passivating dopants.

As a further alternative, hydrogen isotopes may be incorporated in the current blocking layer 11. M. S. Brandt et al. report, in Appl. Phys. Lett., Vol. 64, pp 2264-2266 (1994), that deuterium ($^2$H) may be used in place of hydrogen ($^1$H) to passivate p-type dopants in GaN. Thus, hydrogen in the form of deuterium may be incorporated in the current blocking layer 11 to passivate the dopants. To achieve this, deuterium gas may be supplied to the growth chamber, and cracked to provide atomic deuterium. In principle, other isotopes of hydrogen may be used.

The invention may also be effected by using a mixture of hydrogen and hydrogen isotopes (for example a mixture of $^1$H and $^2$H), or using a mixture of hydrogen isotopes of different atomic weight.

Once the growth of the current blocking layer 11 is completed, the supply of constituents to the growth chamber is changed to prevent significant incorporation of hydrogen into the material being grown. For example, the supply of hydrogen, ammonia, deuterium etc. to the MBE growth chamber may be discontinued. It should be noted however that, if ammonia is used as the source of both hydrogen and nitrogen for the MBE growth of a nitride material, the supply of ammonia must be maintained to provide nitrogen for the MBE growth. In this case, the supply rate of ammonia may be reduced once growth of the current blocking layer 11 is completed so that MBE growth continues but with no significant incorporation of hydrogen. Alternatively, if a mechanism for additional cracking of ammonia is provided, this additional cracking mechanism may be stopped to prevent significant incorporation of hydrogen (thermal cracking of ammonia at the growth surface will still occur to provide nitrogen).

One or more further semiconductor layers are then grown over the current blocking layer 11, to complete the device structure. The further nitride semiconductor layers are denoted generally by 12 in FIG. 2. The further nitride semiconductor layers 12 may be doped p-type (in general, in a typical device structure the layers below the active region 3 will be doped n-type and layers above the active region 3 will be doped p-type).

In principle, the step of incorporating hydrogen into the current blocking layer 11 need not be carried out during growth of the current blocking layer. In principle it is possible to terminate the MBE growth process once the current blocking layer 11 had been grown, remove the structure from the growth chamber, and incorporate hydrogen or an isotope of hydrogen in to the current blocking layer 11 outside the growth chamber using, for example, a hydrogen diffusion process or a hydrogen implantation process. The wafer is then returned to the growth chamber to allow growth of the further nitride layers 12.

Hydrogen is not intentionally incorporated into the further nitride semiconductor layer(s) grown over the current blocking layer 11, nor into the intervening semiconductor layer(s) 10 grown between the active region 3 and the current blocking layer 11. If these layers are doped p-type they will therefore have a low electrical resistance. Growth of the one or more further nitride semiconductor layers 12 is shown as step 3 in FIG. 4.

Figure 3:
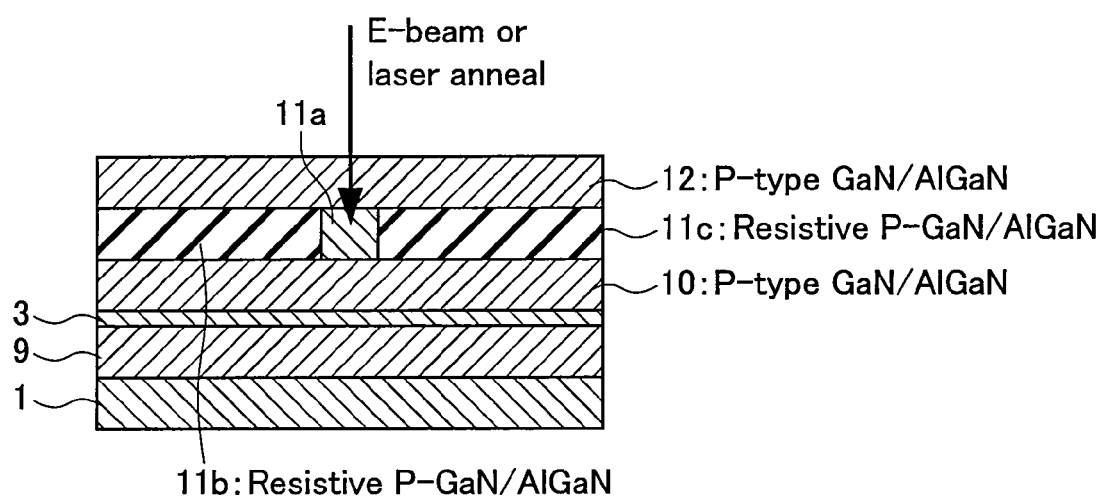

Next, at step 4 the layer structure is subjected to a selective annealing process, in which a selected portion of the current blocking layer 11 is annealed. The effect of the selective annealing process is that p-type dopants in the portion of the current blocking layer 11 that is annealed are activated, and the resistance of the selected portion of the current blocking layer 11 is thereby reduced. The parts of the current blocking layer 11 that are not annealed will, however, remain highly resistive since, the dopants in these parts of the current blocking layer 11 will not be activated during the annealing process. The result of the annealing step is shown in FIG. 3, which illustrates the annealing of a selected portion 11a of the current blocking layer. The resistance of the selected portion of 11a of the current blocking layer is made low as a result of the annealing process, whereas the un-annealed portions 11b, 11c of the current blocking layer 11 remain highly resistive. Thus, the resistance of the current blocking layer has been selectively modified.

The annealing step has substantially no effect on the resistivity of the further nitride semiconductor layer(s) 12. Hydrogen was not incorporated into these layers during the growth process, so that the dopants in the layers 12 were fully activated. The annealing process thus has no effect on the free carrier concentration of the portion(s) of the further layer(s) 12 that is/are annealed. Similarly, the underlying nitride semiconductor layer(s) 10 is/are unaffected by the annealing step.

The structure may then undergo further processing steps to define a desired device structure. For example, the further nitride semiconductor layer(s) 12 may be selectively etched to reduce their lateral extent, to create a device structure similar to that shown in FIG. 1. Electrical contacts may also be deposited on the structure. These further processing steps may be conventional, and will not be described further.

The annealing step may be carried out using a laser beam. By scanning a laser beam over the selected portion 11a of the current blocking layer 11 it is possible locally to heat the selected portion 11a of the blocking layer (without heating the other portions 11b, 11c of the current blocking layer), thereby activating the dopants in the selected portion 11a of the current blocking layer. Alternatively, the annealing step may be carried out using an electron beam; the electron beam is again scanned over the selected portion of the current blocking layer 11 locally to heat the selected portion 11a of the current blocking layer (without heating the other portions 11b, 11c of the current blocking layer) and activate the dopants within the selected portion of the current blocking layer.

In contrast to the method proposed by U.S. Pat. No. 6,258,614, the annealing step of the present invention is not a bandgap-specific annealing process. The wavelength of the laser used in the annealing process, or the energy of the electron beam used in the annealing process, is therefore not constrained by the band gap of the blocking layer 11.

As a further alternative, the annealing process may be carried out by directing an electrical current through the selected portion 11a of the current blocking layer while not passing a current through the other portions 11b, 11c of the current blocking layer. This leads to localised heating in the selected portion 11a of the current blocking layer as a consequence of a Joule heating (without heating the other portions 11b, 11c of the current blocking layer), and again leads to activation of p-type dopants in the selected portion of the current blocking layer. The localised heating in the selected portion 11a of the current blocking layer is sufficient to heat the selected portion 11a of the current blocking layer to a temperature at which thermal annealing occurs.

The temperature at which thermal annealing of Mg-doped GaN occurs is typically 550° C. or above (see, for example, Y. Kamiura et al., Jpn. J. Appl. Phys. Vol. 37, pp. L970-L971 (1998)). It should be noted that when the selected portion 11a of the current blocking layer is heated as a consequence of the Joule heating induced by the current flow through the selected portion, heat will pass into other, non-selected parts of the current blocking layer by thermal conduction. It is therefore preferred that the temperature to which the selected portion 11a of the current blocking layer is heated in the annealing step is not made too high, to prevent annealing occurring in non-selected parts of the current blocking layer. Heating the selected portion 11a of the current blocking layer to a temperature in the range 550° C. to 650° C., for example to approximately 600° C., should ensure satisfactory annealing of the selected portion 11a of the current blocking layer without leading to significant annealing of other parts of the current blocking layer.

In order to heat the selected portion 11a of the current blocking layer to a temperature in the range 550° C. to 650° C., it is necessary for the current density through the selected portion 11a of the current blocking layer to be of the order of 5 kA/cm$^2$. S. Figge et al. have shown, in phys. stat. sol. (a) Vol. 200, No. 1, pp 83-86 (2003), that a device temperature of approximately 600° C. may be obtained using a current density of 5 kA/cm$^2$. In order to obtain such a current density, it is necessary for voltages to be applied to the device structure such that it is forward biased (that is, the potential of the p-electrode should be more positive than the potential of the n-electrode). Such current densities are impossible to obtain by applying reverse-bias voltages, and attempting to obtain them by applying reverse-bias voltages would lead to destruction of the device.

In order to heat the selected portion 11a of the current blocking layer to a temperature in the range 550° C. to 650° C. to effect thermal annealing of the selected portion 11a of the current blocking layer, current must typically be supplied for a time in the range from approximately 5 minutes to approximately 60 minutes. The exact duration required will depend on the current density through the selected portion 11a of the current blocking layer, with a higher current density requiring a shorter duration.

The effect of annealing the selected portion 11a of the current blocking layer is to reduce the electrical resistance of the selected portion 11a of the current blocking layer. It is well known that thermal annealing of p-doped GaN results in the thermal dissolution of Mg—H complexes and removal of hydrogen from the crystal (see, for example, M Takeya et al., Jpn. J. Appl. Phys. Vol. 40, pp. 6260-6262 (2001)). Mg—H complexes are formed during crystal growth in the presence of hydrogen, and it is necessary to dissociate the Mg—H complexes in order to activate the Mg dopant and achieve a low electrical resistivity. This occurs whether the annealing is induced by a laser beam or electron beam or by Joule heating.

The effect of annealing the selected portion 11a of the current blocking layer is that the electrical resistivity of the selected portion will decrease by at least a factor of 2 (ie, will fall to 50% or less of its value before annealing)—see for example H. Amano et al. (above). Moreover, the decrease in resistivity of the selected portion 11a of the current blocking layer will typically be much greater than this, and the resistivity of the selected portion 11a of the current blocking layer will typically decrease by an order of magnitude. H. Amano et al. (above) have shown that the resistivity of p-doped GaN decreases from more than $10^8$ Ωcm to 35 Ωcm upon removal of hydrogen.

It should be noted that the method of U.S. Pat. No. 6,242,761 comprises applying a reverse bias voltage across the layer structure. As is well-known, the current density that may be obtained by applying a reverse bias voltage is very low; the maximum current density obtained will be below 1 A/cm$^2$, probably many orders of magnitude lower—see P. Kozodoy et al., Appl. Phys. Lett. Vol. 73, p 975-977 (1998). The resultant Joule heating may be calculated according to the method of G. Hatakoshi et al. in Jpn. J Appl. Phys. Vol. 38, pp. 2764-2768 (1999), and is found to be very weak—it is likely to lead to an increase in temperature along the current path of no more than 0.01° C. It is not possible to achieve sufficient Joule heating to effect thermal annealing using the method of U.S. Pat. No. 6,242,761.

The present invention thus makes it possible to provide a current aperture in a layer that is not the uppermost layer of a semiconductor layer. The selected portion 11a of the blocking layer that is irradiated, in the embodiment of FIGS. 2 and 3, has a low electrical resistance and thus forms a current aperture that can pass current from an electrode located above the current blocking layer 11 into the active region. The current blocking layer is not located at the surface of the layer structure, as the one or more further semiconductor layers 12 are disposed over the current blocking layer. The present invention thus makes it possible to produce a current aperture at a desired location within a layer structure.

It should be noted that, in an embodiment in which the annealing step is carried out by passing an electrical current through the layer structure to cause Joule heating of a selected part 11a of the layer 11, the electrical contacts that are required for the annealing step may not be the same as the electrical contacts desired in the final device. For example, the upper contact 5 of the device shown in FIG. 1 could not be used as a contact in the step of annealing by Joule heating in order to create the central current aperture shown in FIG. 1—if the contact 5 were used in the step of annealing by Joule heating, an annular current aperture would result.

Figure 1:
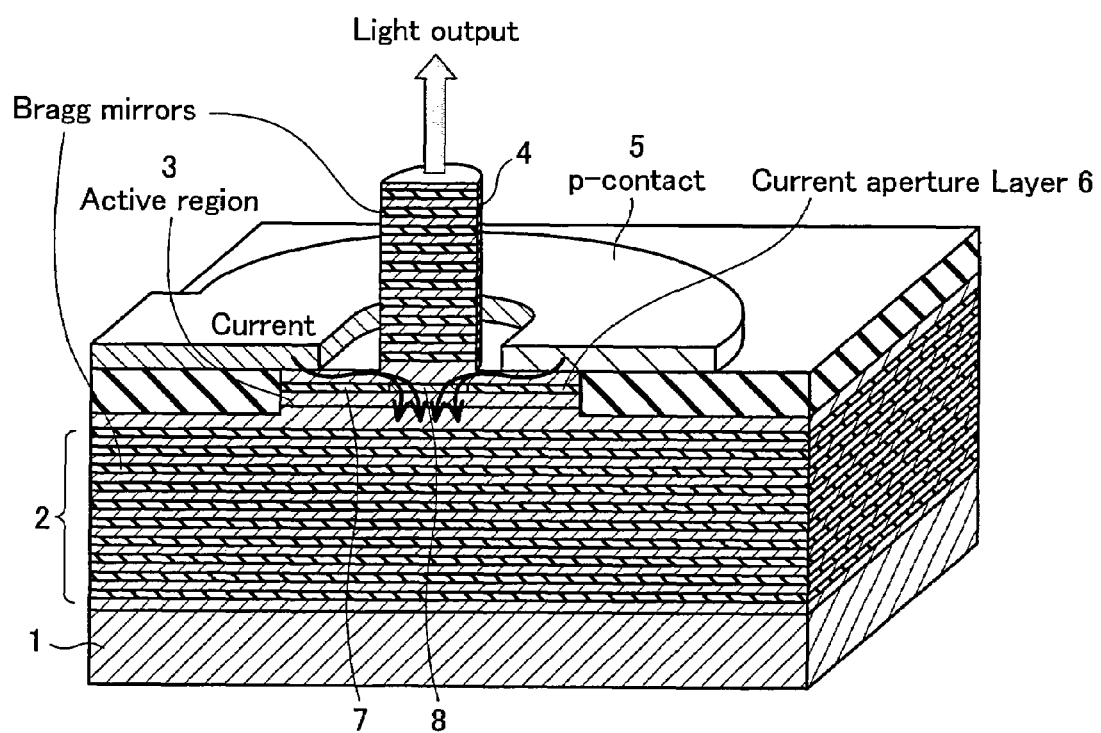
FIG. 1 is a schematic sectional view of a vertical cavity semiconductor laser device incorporating a current aperture.

In order to create the device structure shown in FIG. 1, it would be necessary, after growth of the layers, initially to deposit first contacts which define the desired aperture in the current blocking layer. The first contacts may, for example, comprise one contact on the upper surface of the device structure, corresponding generally in position, size and shape to the desired current aperture to be formed in the current blocking layer, and a contact on the lower face of the substrate 1 that again corresponds generally in position, size and shape to the desired current aperture to be formed in the current blocking layer—so that the contacts give a well-defined current path through the current blocking layer 11. In the annealing step a forward bias voltage is applied across these contacts, to induce current flow and Joule heating in the desired region 11a of the current blocking layer 11. After the annealing step is complete the first contacts are removed, and suitable contacts for the final device are deposited such as, for example an annular contact similar to the contact 5 shown in FIG. 1 and a contact covering the entire area of the lower face of the substrate 1 (to minimise the device resistance). Alternatively, if it were desired to extract light through the bottom surface of the device as well as through the top surface, an annular contact may be deposited on the lower face of the substrate 1.

Alternatively, it may be possible for the contact on the lower surface of the substrate 1 to be used both for the annealing step and in the finished device. In such case, it would only be necessary to remove the upper contact after the annealing step, and deposit a replacement upper contact suitable for the finished device.

Thus, manufacture of a device structure similar to that shown in FIG. 1 according to an embodiment in which the annealing step is carried out by passing an electrical current through the layer structure would require the following steps:

1. grow the layer structure;
2. deposit a contact on centre of upper surface, and deposit a contact on the lower surface of the substrate 1;
3. apply a forward bias voltage to anneal a desired portion of the current blocking layer 11 and thereby define a current aperture;
4. remove the contact from the upper surface;
5. etch the upper layer(s) 12 to define the upper Bragg stack; and
6. deposit an annular contact 5 on the upper surface exposed in the etching step.

Alternatively, step (5) could in principle be carried out before step (2).

If desired, step (4) may also include removing the contact from the lower face of the substrate 1, and step (6) may also include depositing a new contact on the lower face of the substrate 1.

In order to prevent a significant change in the resistance of the one or more further semiconductor layers 12 during the annealing step, these layers must be grown such that little or no hydrogen is incorporated in the one or more further semiconductor layers 12. This may be done by growing the one or more further semiconductor layers 12 by MBE, as described herein. It may alternatively by done by growing the one or more further semiconductor layers 12 using an MOCVD process that does not use $H_2$ as a carrier gas, and that uses nitrogen sources that do not release hydrogen (in particular, this requires that ammonia is not used as a nitrogen source). A suitable hydrogen-free MOCVD process is described in U.S. RE Pat. No. 38,613.

The prevention of a significant change in the resistance of the one or more further semiconductor layers 12 during the annealing step provides considerable advantages. It enables the fabrication of devices in which the uppermost semiconductor layer of the device has a low resistivity, and which contain a buried current aperture—that is, a low resistance aperture in a layer that is otherwise of high resistivity and that is "buried" within the device structure. Since the entire area of the uppermost layer may be of low resistivity, the contribution of this layer to the overall resistance of the device is very low.

In contrast, in the method of U.S. Pat. No. 6,242,761 a low resistance region is created in every layer of the layer structure. In the p-type layers Mg (the p-dopant) is activated in the portions of the p-type layers through which current flows, so that a low resistance region is created in every p-type layer. Moreover, application of the reverse bias voltage also causes hydrogen in the n-type layers to separate from the crystal in the portions of the n-type layers through which current flows, so that a low resistance region is created in every n-type layer. Indeed, the active region will in practice be n-type doped, as is always the case for nominally undoped nitride semiconductor material (whether grown by MOCVD or MBE), so that application of the reverse bias voltage will also lead to formation of a low resistance region in the active layer.

Moreover, in a device in which all layers are of high resistance and have a low resistance current aperture, as in U.S. Pat. No. 6,242,761, the overall resistance of the device will be relatively high; the smaller is the area of the current aperture in each layer, the higher will be the overall resistance of the device.

A further benefit of the invention is that the upper contact on the resultant device does not have to be placed on top of the aperture, but may be placed to the side (as shown in FIG. 1). This is possible because the buried current aperture confines current into the desired current path through the layer structure. This feature is particularly advantageous for devices such as vertical cavity emitting lasers and LEDs, in which light is generated underneath the current aperture and must be extracted through the upper surface of the device—by placing the contact to the side, as shown in FIG. 1, the contact does not absorb light generated underneath the current aperture and emitted through the upper surface of the device.

The method of the present invention does not rely on photoelectrochemical etching (PEC) or an oxidation process to create a current aperture. Use of PEC etching or an oxidation process may alter or etch the material of the layer structure, and may therefore effect the reliability and lifetime of the resultant device. The present invention does not suffer from this disadvantage, since it does not use photoelectrochemical etching or an oxidation process.

By incorporating sufficient atomic hydrogen into the current blocking layer 11, and thereby passivating the p-type dopants, the current blocking layer 11 may be made to have a high electrical resistance. The blocking layer can therefore be made relatively thin, for example between 10 nm and 200 nm thick. Furthermore, the current blocking layer 11 made be positioned at any suitable point in the layer structure and, in particular, may be kept away from the active region of the device. Making the current blocking layer thin means that the duration of the annealing process can be kept short, thereby reducing the heating of the layer structure caused during the annealing step. The features of being able to keep the current blocking layer thin, and being able to position the current blocking layer away from the active region, mean that unintentional heating of the active region during the annealing step can be minimised. This reduces the risk of degradation of the active region during the annealing step.

The current aperture in the current blocking layer 11 may be given any desired size and shape, by appropriate choice of the region 11a of the blocking layer that is heated during the annealing step. Where the annealing is carried out by irradiation with a laser beam, for example, the area of the current blocking layer 11 that is scanned by the laser beam may be chosen to provide any desired size and shape for the current aperture. For instance the current aperture may be circular or rectangular in cross-section.

In the embodiment of FIGS. 2 and 3, the current blocking layer 11 is grown as a p-type layer. The layer is not limited to this, however, and the current blocking layer 11 could alternatively be grown as a compensated layer which contains both p-type dopants and n-type dopants. If the doping concentration of the p-type dopants and the doping concentration of the n-type dopants are chosen appropriately the current blocking layer will be "compensated", in that the p-type dopants will substantially cancel out the n-type dopants, so that the current blocking layer contains no free charge carriers. The current blocking layer 11 would then have a high electrical resistance.

The effect of incorporating hydrogen into the current blocking layer during, or after, its growth would again be to passivate the p-type dopants. As a consequence the p-dopants would no longer be able to compensate the n-type dopants, and the current blocking layer would be overall n-type and so, after growth but before the annealing step, would have a low electrical resistance.

When the annealing step is carried out, the effect of the annealing process would be again to activate the p-type dopants in the portion of the current blocking layer that is irradiated. This would allow the p-dopants to compensate the n-type dopants and the effect of the annealing process would therefore the increase the resistance of the annealed portion of the blocking layer. The resistance of the un-annealed portion would again be unchanged by the annealing step, and would again remain low. In this embodiment, therefore, the effect of the selective annealing step is to define highly resistive regions in the blocking layer 11, and the un-annealed regions of the blocking layer 11 retain a low resistance and form a current aperture. In this embodiment, the regions 11b and 11c of the current blocking layer shown in FIG. 3 would be annealed, and the region 11a would not be annealed, and so would remain with a low resistance and would form a current aperture.

Figure 5:
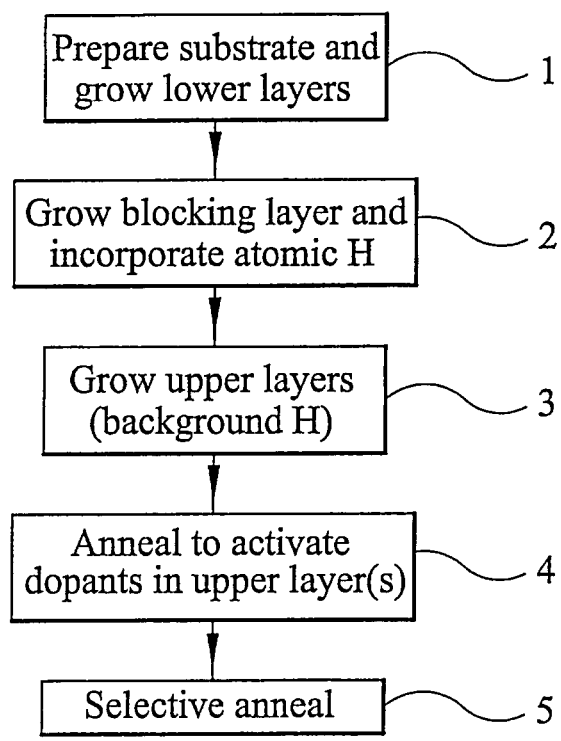
FIG. 5 is a schematic flow diagram illustrating a method according to a second embodiment of the present invention.

FIG. 5 is a flow diagram illustrating a further embodiment of the present invention. The method of FIG. 5 is applicable when the layer structure is grown in the presence of a high hydrogen background. The method of FIG. 5 is applicable, for example, in the case of MOCVD growth. As is well-known, MOCVD growth is usually carried out in the presence of a high hydrogen background, so that hydrogen will naturally be incorporated into a semiconductor layer grown by MOCVD. Thus, when a p-type doped nitride semiconductor layer is grown by MOCVD, the layer inherently has a high electrical resistance as the incorporated hydrogen passivates the p-type dopants in the layer. As is also known, a p-type layer grown by MOCVD requires annealing in order to activate the dopants.

Thus, in the method of FIG. 5 a layer of nitride semiconductor that is intended to form a blocking layer in a layer structure is grown over a substrate at step 2. It will be assumed that the blocking layer is grown p-type for the description of this embodiment, but the blocking layer could alternatively be a compensated p-type doped and n-doped layer.

The blocking layer would normally incorporate hydrogen, as a result of the hydrogen background in a MOCVD growth chamber. In step 2, however, additional hydrogen is incorporated into the blocking layer, so that the hydrogen content of the layer is greater than the hydrogen content that would arise from the naturally occurring background in the reaction chamber.

As in the method of FIG. 4, the additional hydrogen may be incorporated into the blocking layer during the growth of the blocking layer, by providing atomic hydrogen or an isotope of hydrogen within the reaction chamber. This may be done in any of the ways mentioned above with reference to step 2 of FIG. 4. Alternatively, the additional hydrogen may be incorporated into the blocking layer after it has been grown, by removing the blocking layer from the reaction chamber and incorporating additional hydrogen by, for example, a hydrogen implantation process or a hydrogen diffusion process.

As is the case with the method of FIG. 4, steps such as preparing and cleaning a suitable substrate and growing one or more semiconductor layers over the substrate may be carried out before the current blocking layer is grown in step 2 of FIG. 5. These steps are denoted generally by "1" in FIG. 5; these steps are conventional, and will not be described further.

In step 3 of FIG. 5, one or more further semiconductor layers are grown over the current blocking layer 11. These correspond to the layer(s) denoted as "12" in the structure of FIG. 2. The number thickness and composition of the further layer(s) 12 grown in step 3 will depend on the device structure that is being grown. The further semiconductor layer(s) 12 may be doped, and in many devices they will be doped p-type.

The further nitride semiconductor layer(s) grown in step 12 will contain hydrogen, as a result of the normal hydrogen background in the growth chamber. Thus, while the current blocking layer 11 and the further layers 12 will all contain hydrogen, the current blocking layer 11 will have a greater hydrogen content than the further semiconductor layers 12.

Since the further semiconductor layers 12 contain hydrogen, any p-type dopants in the further semiconductor layer(s) will be passivated. The method of FIG. 5 therefore includes the step of annealing the layer structure to activate p-type dopants in the further semiconductor layer(s) 12. This step is a conventional annealing step and is not a selective annealing step. As an example, the annealing step 4 may be carried out in the growth chamber, as an in-situ annealing step, by increasing the growth temperature within the growth chamber. Alternatively, the annealing step may be carried out after the layer structure has been removed from the growth chamber. The annealing step 4 may be carried out using any suitable technique.

The effect of the annealing step, step 4 is to activate p-type dopants in the further nitride semiconductor layer(s) 12. The conditions of the annealing step are, however, chosen so that, as a consequence of the greater hydrogen content of the current blocking layer 11, the p-type dopants in the current blocking layer 11 are not fully activated. Thus, the result of step 4 of FIG. 5 is that the further nitride semiconductor layers will have a low resistivity, and the p-type dopants in the further layer(s) 12 will be fully activated, or almost fully activated during the annealing step 4. The blocking layer 11 will, however, still have a high resistance, as the greater hydrogen content of the blocking layer means that the p-type dopants in the blocking layer will not have been fully activated during the annealing step. The method of FIG. 5 thus allows the invention to be implemented using a conventional MOCVD growth process which has a high hydrogen background. (In the case of an MOCVD growth process that does not have a high hydrogen background, such the growth process of U.S. Pat. No. 6,043,140, the invention may be implemented using the method of FIG. 4.)

The method of FIG. 5 further includes, as step 5, a selective annealing step. The selective annealing step 5 of FIG. 5 corresponds to the selective annealing step 4 of FIG. 4, and comprises annealing a selected portion 11*a* of the current blocking layer 11 while not annealing other portions 11*b*, 11*c* of current blocking layer. The result of the selective annealing step 5 is that the p-type dopants in the selected region 11*a* of the current blocking layer 11 are fully activated, so that the selected region 11*a* of the current blocking layer has a low resistance. The resistance of the parts 11*b*, 11*c* of the blocking layer that are not annealed will however remain high as p-type dopants in these parts of the blocking layer 11 are not fully activated. Thus, the method of FIG. 5 again obtains a current blocking layer that is buried within the layer structure, and that includes a current aperture corresponding to the annealed portion 11*a*.

Since the p-type dopants in the further nitride semiconducting layer(s) 12 are fully activated, or almost fully activated, in the first annealing step (step 4 of FIG. 5), the selective annealing step has little, if any, effect on the resistance of the further nitride semiconductor layer(s) 12. The resistance of the further nitride semiconductor(s) layer remains low.

The method of FIG. 5 has been described above with reference to an embodiment in which the current blocking layer 11 is doped p-type. The method may also be applied with a current blocking layer 11 that is compensation doped and contains both p-type dopants and n-type dopants. As described above, the result of incorporating hydrogen into a compensation-doped layer is that the resistivity will be low, as the p-type dopants will be passivated by the hydrogen and so cannot compensate the n-type dopants. After the selective annealing step of FIG. 5, the effect would again be that the areas of the current blocking layer that have been annealed will have a high resistance (because the p-type dopants will be activated and so can compensate the n-type dopants), whereas the areas of the blocking layer that are not annealed will have a low resistance (as the p-type dopants are still passivated, and cannot compensate the n-type dopants).

The present invention may be applied in any nitride semiconductor system, to provide a device structure that requires layer having a region of modified electrical resistivity within the device structure. The invention may be applied to the growth of, for example, an edge-emitting laser diode, a vertical cavity laser diode, a light-emitting diode, a resonant cavity light-diode and many electronic devices.

One example of a suitable p-type dopant for incorporation in the current blocking layer 11, and in the intervening nitride semi-conductor layer(s) 10 and/or the further nitride layer(s) 12 is magnesium. In an embodiment in which the blocking layer 11 is grown as a compensated p-type doped and n-type doped layer, one example of a suitable p-type dopant is magnesium and a suitable n-type dopant is silicon.

The invention has been described above with reference to a nitride semiconductor system, in particular the (Al,Ga,In)N system. However, the invention is not limited to use with a nitride semiconductor system and may be applied to other material systems. It may in principle be applied in any material system in which dopants are capable of being passivated by incorporation of hydrogen and of being activated by annealing.

The invention has been described above with reference to a method in which only a portion of the layer 11 is annealed to change its resistivity, and in which one or more other parts of the layer 11 are not annealed. In principle, however, the entire area, or substantially the entire area, of the layer 11 may be annealed. This allows the resistivity of the layer 11 to be changed over its entire area (or over substantially its entire area), without affecting the resistivity of the overlying layers 12.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method of growing a semiconductor layer structure comprising the steps of:
 a) growing a first semiconductor layer;
 b) incorporating hydrogen into the first semiconductor layer;
 c) growing one or more further semiconductor layers over the first semiconductor layer thereby to form a semiconductor layer structure; and
 d) annealing a selected portion of the first semiconductor layer thereby to change the electrical resistance of the selected portion of the first semiconductor layer;
 wherein hydrogen is not incorporated into the one or more further semiconductor layers so that the annealing step does not significantly change the electrical resistance of the one or more further semiconductor layers.

2. A method as claimed in claim 1 and comprising the further step of:
 e) annealing the semiconductor layer structure to obtain a desired electrical resistance for the one or more further semiconductor layers, step (e) being carried out before step (d) whereby step (d) does not significantly change the electrical resistance of the one or more further semiconductor layers.

3. A method as claimed in claim 1 wherein step (b) of incorporating hydrogen into the first semiconductor layer increases the electrical resistance of the first semiconductor layer, and wherein step (d) of annealing the selected portion of the first semiconductor layer reduces the electrical resistance of the selected portion of the first semiconductor layer.

4. A method as claimed in claim 3 wherein step (a) comprises incorporating a p-type dopant into the first semiconductor layer.

5. A method as claimed in claim 1 wherein step (b) of incorporating hydrogen into the first semiconductor layer reduces the electrical resistance of the first semiconductor layer, and wherein step (d) of annealing the selected portion of the first semiconductor layer increases the electrical resistance of the selected portion of the first semiconductor layer.

6. A method as claimed in claim 5 wherein step (a) comprises incorporating a p-type dopant and an n-type dopant into the first semiconductor layer.

7. A method as claimed in claim 1 wherein step (b) is performed simultaneously with step (a).

8. A method as claimed in claim 1 wherein step (b) is performed subsequent to step (a).

9. A method as claimed in claim 1 wherein step (d) comprises annealing the selected portion of the first semiconductor layer with a laser beam.

10. A method as claimed in claim 1 wherein step (d) comprises annealing the selected portion of the first semiconductor layer with an electron beam.

11. A method as claimed in claim 1 wherein step (d) comprises applying a forward bias voltage across the layer structure thereby to pass an electrical current through the selected portion of the first semiconductor layer.

12. A method as claimed in claim 11 and comprising passing an electrical current such that the current density in the selected portion of the first semiconductor layer is 5 kA/cm$^2$ or greater.

13. A method as claimed in claim 1 wherein the selected portion of the first semiconductor layer is substantially the entire area of the first semiconductor layer.

14. A method as claimed in claim 1 wherein the first semiconductor layer is a nitride semiconductor layer.

15. A method as claimed in claim 14 wherein the one or more further semiconductor layers are nitride semiconductor layers.

16. A method as claimed in claim 14 wherein the first semiconductor layer is an (Al,Ga,In)N layer.

17. A method as claimed in claim 15 wherein the or each further semiconductor layer is an (Al,Ga,In)N layer.

18. A method as claimed in claim 1 wherein step (b) comprises providing atomic hydrogen.

19. A method as claimed in claim 1 wherein step (b) comprises providing an isotope of hydrogen.

20. A method as claimed in claim 1, wherein step (a) and step (c) comprises growing the first semiconductor layer and the one or more further semiconductor layers by molecular beam epitaxy.

21. A method as claimed in claim 1, wherein step (a) and step (c) comprises growing the first semiconductor layer and the one or more further semiconductor layers by metal organic chemical vapour deposition.

22. A method as claimed in claim 1 wherein the or each further semiconductor layer is doped p-type.

23. A semiconductor layer structure grown by a method as defined in claim 1.

24. A semiconductor laser diode comprising a semiconductor layer structure as claimed in claim 23.

25. A semiconductor light-emitting diode comprising a semiconductor layer structure as claimed in claim 23.

26. A method of growing a semiconductor layer structure comprising the steps of:
 a) growing a first semiconductor layer;
 b) incorporating hydrogen into the first semiconductor layer;
 c) growing one or more further semiconductor layers over the first semiconductor layer thereby to form a semiconductor layer structure; and
 d) annealing a selected portion of the first semiconductor layer thereby to change the electrical resistance of the selected portion of the first semiconductor layer;

wherein hydrogen is incorporated into the one or more further semiconductor layers to a concentration lower than the concentration of hydrogen incorporated into the first semiconductor layer so that the annealing step does not significantly change the electrical resistance of the one or more further semiconductor layers.

27. A method as claimed in claim 26 and comprising the further step of:
e) annealing the semiconductor layer structure to obtain a desired electrical resistance for the one or more further semiconductor layers, step (e) being carried out before step (d) whereby step (d) does not significantly change the electrical resistance of the one or more further semiconductor layers.

28. A method as claimed in claim 26 wherein step (b) of incorporating hydrogen into the first semiconductor layer increases the electrical resistance of the first semiconductor layer, and wherein step (d) of annealing the selected portion of the first semiconductor layer reduces the electrical resistance of the selected portion of the first semiconductor layer.

29. A method as claimed in claim 28 wherein step (a) comprises incorporating a p-type dopant into the first semiconductor layer.

30. A method as claimed in claim 26 wherein step (b) of incorporating hydrogen into the first semiconductor layer reduces the electrical resistance of the first semiconductor layer, and wherein step (d) of annealing the selected portion of the first semiconductor layer increases the electrical resistance of the selected portion of the first semiconductor layer.

31. A method as claimed in claim 30 wherein step (a) comprises incorporating a p-type dopant and an n-type dopant into the first semiconductor layer.

32. A method as claimed in claim 26 wherein step (b) is performed simultaneously with step (a).

33. A method as claimed in claim 26 wherein step (b) is performed subsequent to step (a).

34. A method as claimed in claim 26 wherein step (d) comprises annealing the selected portion of the first semiconductor layer with a laser beam.

35. A method as claimed in claim 26 wherein step (d) comprises annealing the selected portion of the first semiconductor layer with an electron beam.

36. A method as claimed in claim 26 wherein step (d) comprises applying a forward bias voltage across the layer structure thereby to pass an electrical current through the selected portion of the first semiconductor layer.

37. A method as claimed in claim 36 and comprising passing an electrical current such that the current density in the selected portion of the first semiconductor layer is 5 $kA/cm^2$ or greater.

38. A method as claimed in claim 26 wherein the selected portion of the first semiconductor layer is substantially the entire area of the first semiconductor layer.

39. A method as claimed in claim 26 wherein the first semiconductor layer is a nitride semiconductor layer.

40. A method as claimed in claim 39 wherein the one or more further semiconductor layers are nitride semiconductor layers.

41. A method as claimed in claim 39 wherein the first semiconductor layer is an (Al,Ga,In)N layer.

42. A method as claimed in claim 40 wherein the or each further semiconductor layer is an (Al,Ga,In)N layer.

43. A method as claimed in claim 26 wherein step (b) comprises providing atomic hydrogen.

44. A method as claimed in claim 26 wherein step (b) comprises providing an isotope of hydrogen.

45. A method as claimed in claim 26, wherein step (a) and step (c) comprises growing the first semiconductor layer and the one or more further semiconductor layers by molecular beam epitaxy.

46. A method as claimed in claim 26, wherein step (a) and step (c) comprises growing the first semiconductor layer and the one or more further semiconductor layers by metal organic chemical vapour deposition.

47. A method as claimed in claim 26 wherein the or each further semiconductor layer is doped p-type.

48. A semiconductor layer structure grown by a method as defined in claim 26.

49. A semiconductor laser diode comprising a semiconductor layer structure as claimed in claim 48.

50. A semiconductor light-emitting diode comprising a semiconductor layer structure as claimed in claim 48.

* * * * *